(12) United States Patent
Ueda et al.

(10) Patent No.: US 8,630,136 B2
(45) Date of Patent: Jan. 14, 2014

(54) SEMICONDUCTOR MEMORY (75) Inventors: Yoshihiro Ueda, Yokohama (JP); Kosuke Hatsuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 13/422,110

(22) Filed: Mar. 16, 2012

(65) Prior Publication Data

US 2012/0320665 A1 Dec. 20, 2012

(30) Foreign Application Priority Data

Jun. 20, 2011 (JP) ................................. 2011-136074

(51) Int. Cl.
*G11C 7/00* (2006.01)
(52) U.S. Cl.
USPC ..................................... 365/196; 365/185.21
(58) Field of Classification Search
USPC ........................................... 365/196, 185.21
See application file for complete search history.

(56) References Cited

U.S. PATENT DOCUMENTS

| | | | |
|---|---|---|---|
| 7,755,077 B2 | 7/2010 | Inaba | |
| 7,835,210 B2 | 11/2010 | Shimizu | |
| 7,916,522 B2 | 3/2011 | Itagaki et al. | |
| 8,097,875 B2 | 1/2012 | Inaba | |
| 2001/0002886 A1* | 6/2001 | Ooishi | 365/196 |

FOREIGN PATENT DOCUMENTS

| | | |
|---|---|---|
| JP | 2008-084517 | 4/2008 |
| JP | 2008-192990 | 8/2008 |

* cited by examiner

*Primary Examiner* — Jason Lappas
(74) *Attorney, Agent, or Firm* — Knobbe, Martens, Olson & Bear LLP (57) ABSTRACT

A semiconductor memory includes a first memory cell including: a first resistance change element and a first select transistor. The semiconductor memory includes a second memory cell including: a second select transistor and a second resistance change element. The semiconductor memory includes a third memory cell including: a third select transistor and a third resistance change element, the third memory cell acting as a reference cell. The semiconductor memory includes a fourth memory cell including: a fourth resistance change element and a fourth select transistor, the fourth memory cell acting as a reference cell.

20 Claims, 5 Drawing Sheets

SEMICONDUCTOR MEMORY

CROSS-REFERENCE TO RELATED APPLICATION

This application is based upon and claims the benefit of priority from the prior Japanese Patent Application No. 2011-136074, filed on Jun. 20, 2011; the entire contents of which are incorporated herein by reference.

BACKGROUND

1. Field

Embodiments described herein relate generally to a semiconductor memory such as Magnetic Random Access Memory (MRAM).

2. Background Art

In a spin injection MRAM, for example, a reference cell fed with a reference current is necessary for accurate reading of data.

In the case where erroneous writing occurs due to a reference current in such a reference cell, the reference current does not have a desired current value and thus the accuracy of reading data may decrease.

DETAILED DESCRIPTION

A semiconductor memory according to an embodiment includes a first memory cell including: a first resistance change element having a first end connected to a first bit line, and a first select transistor that is connected between a second end of the first resistance change element and a first voltage terminal and has a gate connected to a first word line. The semiconductor memory includes a second memory cell including: a second select transistor having a first end connected to a second bit line and a gate connected to the first word line, and a second resistance change element that has a first end connected to a second end of the second select transistor and a second end connected to a second voltage terminal. The semiconductor memory includes a third memory cell including: a third select transistor that has a first end connected to a third bit line and a gate connected to a second word line, and a third resistance change element that has a first end connected to a second end of the third select transistor and a second end connected to a third voltage terminal, the third memory cell acting as a reference cell. The semiconductor memory includes a fourth memory cell including: a fourth resistance change element having a first end connected to a fourth bit line, and a fourth select transistor that is connected between a second end of the fourth resistance change element and a fourth voltage terminal and has a gate connected to the second word line, the fourth memory cell acting as a reference cell. The semiconductor memory includes a first potential control circuit connected between the third bit line and the fourth bit line to equalize a potential of the third bit line and a potential of the fourth bit line during a reading operation. The semiconductor memory includes a first sense amplifier including a first input terminal connected to a first end of the first bit line and a second input terminal connected to a first end of the third bit line, the first sense amplifier being configured to compare a current passing through a first end of the first bit line and a current passing through the first end of the third bit line during the reading operation and output a reading signal corresponding to a comparison result. The semiconductor memory includes a second sense amplifier including a third input terminal connected to a first end of the second bit line and a fourth input terminal connected to a first end of the fourth bit line, the second sense amplifier being configured to compare a current passing through the first end of the second bit line and a current passing through the first end of the fourth bit line during the reading operation and output a reading signal corresponding to a comparison result.

Hereafter, a semiconductor memory according to the present invention will be described more specifically with reference to the drawings.

Embodiments will be described below with reference to the accompanying drawings.

First Embodiment

Figure 1:
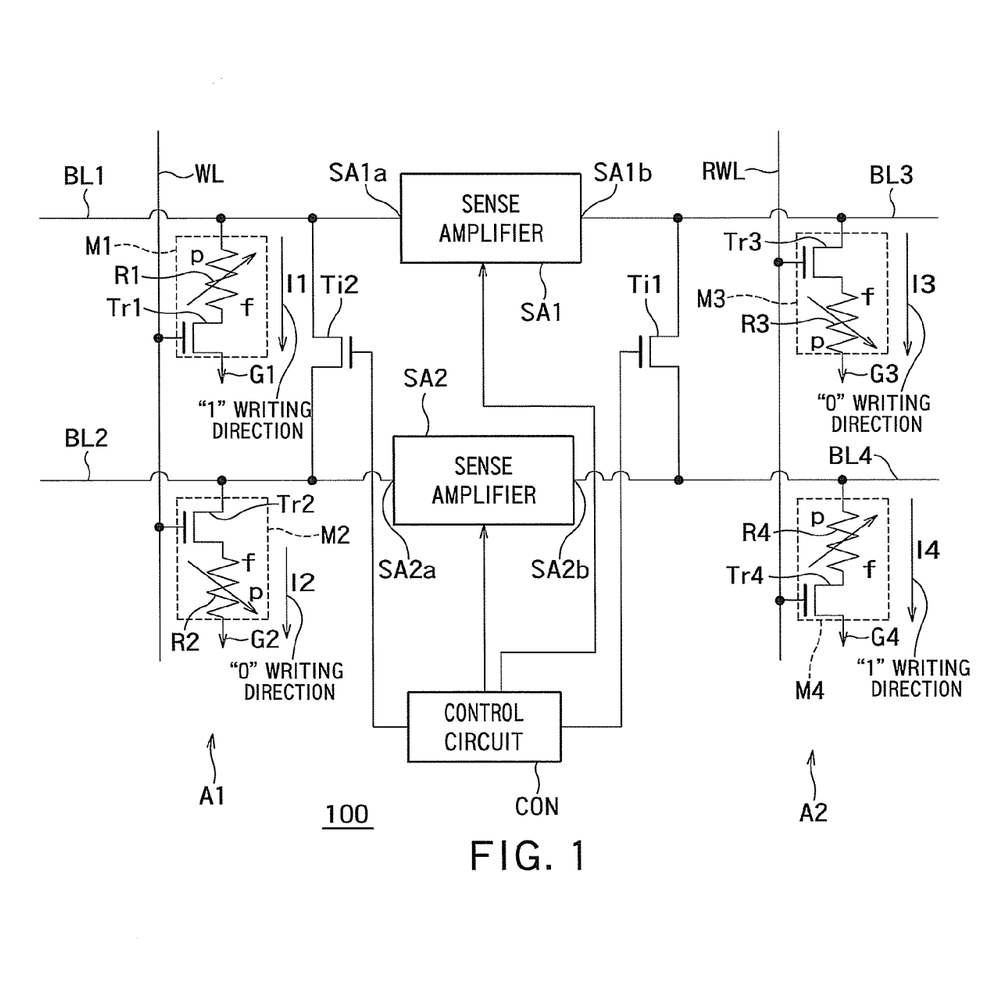
FIG. 1 is a diagram showing an example of the configuration of a semiconductor memory 100 according to a first embodiment.

FIG. 1 illustrates an example of the configuration of a semiconductor memory 100 according to a first embodiment.

As illustrated in FIG. 1, the semiconductor memory 100 includes a first word line WL, a second word line RWL, a first bit line BL1, a second bit line BL2, a third bit line BL3, a fourth bit line BL4, a first memory cell M1, a second memory cell M2, a third memory cell M3, a fourth memory cell M4, a first sense amplifier SA1, a second sense amplifier SA2, a first potential control circuit Ti1, a second potential control circuit Ti2, and a control circuit CON. The semiconductor memory 100 is, for example, a spin injection MRAM.

The semiconductor memory 100 includes multiple word lines arranged in a row direction. In FIG. 1, the two word lines WL and RWL are illustrated.

Moreover, the semiconductor memory 100 includes multiple bit lines arranged in a column direction. In FIG. 1, the four bit lines BL1 to BL4 are illustrated.

A first memory cell array A1 has multiple memory cells including the first memory cell M1 and the second memory cell M2. For example, in the first memory cell array A1, the multiple memory cells are arranged in a matrix in the row direction and the column direction. FIG. 1 illustrates the two memory cells M1 and M2 of the first memory cell array A1.

The first memory cell M1 includes a first resistance change element (e.g., a magnetoresistive element such as an MTJ element) R1 and a first select transistor (MOS transistor) Tr1.

The first resistance change element R1 has one end connected to the first bit line BL1. The first select transistor Tr1 is connected between the other end of the first resistance change element R1 and a first voltage terminal G1 and has its gate connected to the first word line WL.

Particularly, the first resistance change element R1 includes a fixed layer p connected to the first bit line BL1 and a free layer f connected to one end of the first select transistor Tr1.

For example, a reading current I1 is applied to the first memory cell M1 only in a direction along which a first logical value (e.g., "1") is written (that is, a direction from the first bit line BL1 to the first voltage terminal G1).

The second memory cell M2 includes a second resistance change element (e.g., a magnetoresistive element such as an MTJ element) R2 and a second select transistor (MOS transistor) Tr2.

The second select transistor Tr2 has one end (drain) connected to the second bit line BL2 and its gate connected to the first word line WL. The second resistance change element R2 has one end connected to the other end (source) of the second select transistor Tr2 and the other end connected to a second voltage terminal G2.

Particularly, the second resistance change element R2 includes a free layer f connected to the other end of the second select transistor Tr2 and a fixed layer p connected to the second voltage terminal G2.

For example, a reading current I2 is applied to the second memory cell M2 only in a direction along which a second logical value (e.g., "0") different from the first logical value ("1") is written (that is, a direction from the second bit line BL2 to the second voltage terminal G2).

A second memory cell array A2 contains multiple memory cells including the third memory cell M3 and the fourth memory cell M4. For example, in the second memory cell array A2, the multiple memory cells are arranged in a matrix in the row direction and the column direction. FIG. 1 illustrates the two memory cells M3 and M4 of the second memory cell array A2.

The third memory cell M3 acting as a reference cell includes a third resistance change element (e.g., a magnetoresistive element such as an MTJ element) R3 and a third select transistor (MOS transistor) Tr3.

The third resistance change element R3 has one end connected to the third bit line BL3. The third select transistor Tr3 is connected between the other end of the third resistance change element R3 and a third voltage terminal G3 and has its gate connected to the second word line RWL.

Particularly, the third resistance change element R3 includes a free layer f connected to the other end of the third select transistor Tr3 and a fixed layer p connected to the third voltage terminal G3.

In the case where the third memory cell M3 acts as a reference cell, the resistance value of the third resistance change element R3 is set at a resistance value corresponding to a state in which the second logical value ("0") is written.

For example, a reading current (reference current) I3 is applied to the third memory cell M3 only in a direction along which the second logical value (e.g., "0") is written (that is, a direction from the third bit line BL3 to the third voltage terminal G3).

Thus, erroneous writing can be suppressed in the third memory cell M3 acting as a reference cell.

The fourth memory cell M4 acting as a reference cell includes a fourth select transistor (MOS transistor) Tr4 and a fourth resistance change element (e.g., a magnetoresistive element such as an MTJ element) R4.

The fourth select transistor Tr4 has one end (drain) connected to the fourth bit line BL4 and its gate connected to the second word line RWL. The fourth resistance change element R4 has one end connected to the other end (source) of the fourth select transistor Tr4 and the other end connected to a fourth voltage terminal G4.

Particularly, the fourth resistance change element R4 includes a fixed layer p connected to the fourth bit line BL4 and a free layer f connected to the one end of the fourth select transistor Tr4.

In the case where the fourth memory cell M4 acts as a reference cell, the resistance value of the fourth resistance change element R4 is set at a resistance value corresponding to a state in which the first logical value ("1") is written.

For example, a reading current (reference current) I4 is applied to the fourth memory cell M4 only in a direction along which the first logical value ("1") is written (that is, a direction from the fourth bit line BL4 to the fourth voltage terminal G4).

Thus, erroneous writing can be suppressed in the fourth memory cell M4 acting as a reference cell.

The first to fourth voltage terminals G1 to G4 are all electrically connected to, for example, a ground terminal connected to the ground.

In this configuration, the first memory cell array A1 and the second memory cell array A2 are arranged such that a region for the first and second sense amplifiers SA1 and SA2 is interposed between the memory cell arrays. For example, the first memory cell array A1 and the second memory cell array A2 are laid out on a semiconductor substrate (not shown) such that the configuration of the first memory cell array A1 and the configuration of the second memory cell array A2 have point symmetry with respect to the region of the sense amplifiers.

In this case, for example, the first memory cell array A1 is identical in size to the second memory cell array A2.

The third memory cell M3 and the fourth memory cell M4 which are selected as reference cells are laid out, for example, near the center of the second memory cell array A2.

Thus, the resistance value of the reference cell can be set at an average value in the memory cell array.

Furthermore, a word line driver (not shown) controls the voltages of the first and second word lines WL and RWL connected to the gates of the first to fourth select transistors Tr1 to Tr4. The voltages of the first and second word lines WL and RWL are controlled so as to control on (selected)/off (unselected) of the select transistors Tr1 to Tr4.

As illustrated in FIG. 1, the first potential control circuit Ti1 is connected between the third bit line BL3 and the fourth bit line BL4. The first potential control circuit Ti1 equalizes the potential of the third bit line BL3 and the potential of the fourth bit line BL4 during a reading operation on the selected first and second memory cells M1 and M2 of the first memory cell array A1.

The first potential control circuit Ti1 is, for example, a first short transistor (MOS transistor) connected between the third bit line BL3 and the fourth bit line BL4.

The second potential control circuit Ti2 is connected between the first bit line BL1 and the second bit line BL2. The second potential control circuit Ti2 equalizes the potential of the first bit line BL1 and the potential of the second bit line BL2 during a reading operation on the selected memory cells (not shown) of the second memory cell array A2.

The second potential control circuit Ti2 is, for example, a second short transistor (MOS transistor) connected between the first bit line BL1 and the second bit line BL2.

The first sense amplifier SA1 includes a first input terminal SA1a connected to one end of the first bit line BL1 and a second input terminal SA1b connected to one end of the third bit line BL3.

The first sense amplifier SA1 compares a current passing through the one end of the selected first bit line BL1 and a current passing through the one end of the third bit line BL3 during the reading operation on the selected first and second memory cells M1 and M2 of the first memory cell array A1, and then outputs a reading signal corresponding to the comparison result. A logical value stored in the first memory cell M1 is determined based on the reading signal.

For example, a column selecting transistor (not shown) is connected between the one end of the first bit line BL1 and the first input terminal SA1a. The column selecting transistor is turned on to electrically connect the one end of the first bit line BL1 and the first input terminal SA1a during the reading operation. Likewise, a column selecting transistor (not shown) is connected between the one end of the second bit line BL2 and the second input terminal SA1b. The column selecting transistor is turned on to electrically connect the one end of the second bit line BL2 and the second input terminal SA1b during the reading operation.

The second sense amplifier SA2 includes a third input terminal SA2a connected to one end of the second bit line BL2 and a fourth input terminal SA2b connected to one end of the fourth bit line BL4.

The second sense amplifier SA2 compares a current passing through the one end of the selected second bit line BL2 and a current passing through the one end of the fourth bit line BL4 during the reading operation, and then outputs a reading signal corresponding to the comparison result. A logical value stored in the second memory cell M2 is determined based on the reading signal.

For example, a column selecting transistor (not shown) is connected between the one end of the third bit line BL3 and the third input terminal SA2a. The column selecting transistor is turned on to electrically connect the one end of the third bit line BL3 and the third input terminal SA2a during the reading operation. Likewise, a column selecting transistor (not shown) is connected between the one end of the fourth bit line BL4 and the fourth input terminal SA2b. The column selecting transistor is turned on to electrically connect the one end of the fourth bit line BL4 and the fourth input terminal SA2b during the reading operation.

As described above, in the example of FIG. 1, the sense amplifiers are each allocated for the two columns of the memory cell arrays, achieving high density integration.

The control circuit CON controls the word line driver, the first and second sense amplifiers SA1 and SA2, and the first and second potential control circuits Ti1 and Ti2.

Figure 2A:
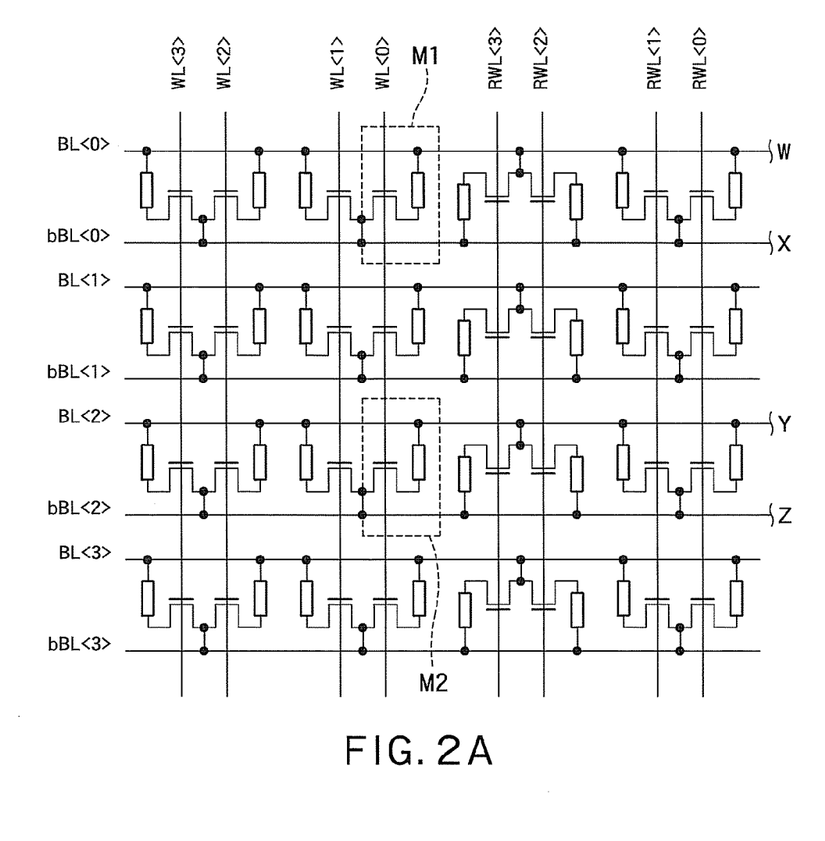
FIGS. 2A to 2C are circuit diagrams showing a specific layout example containing the first and second sense amplifiers SA1 and SA2 and the first to fourth memory cells M1 to M4 of the semiconductor memory 100 illustrated in FIG. 1.
Figure 2B:
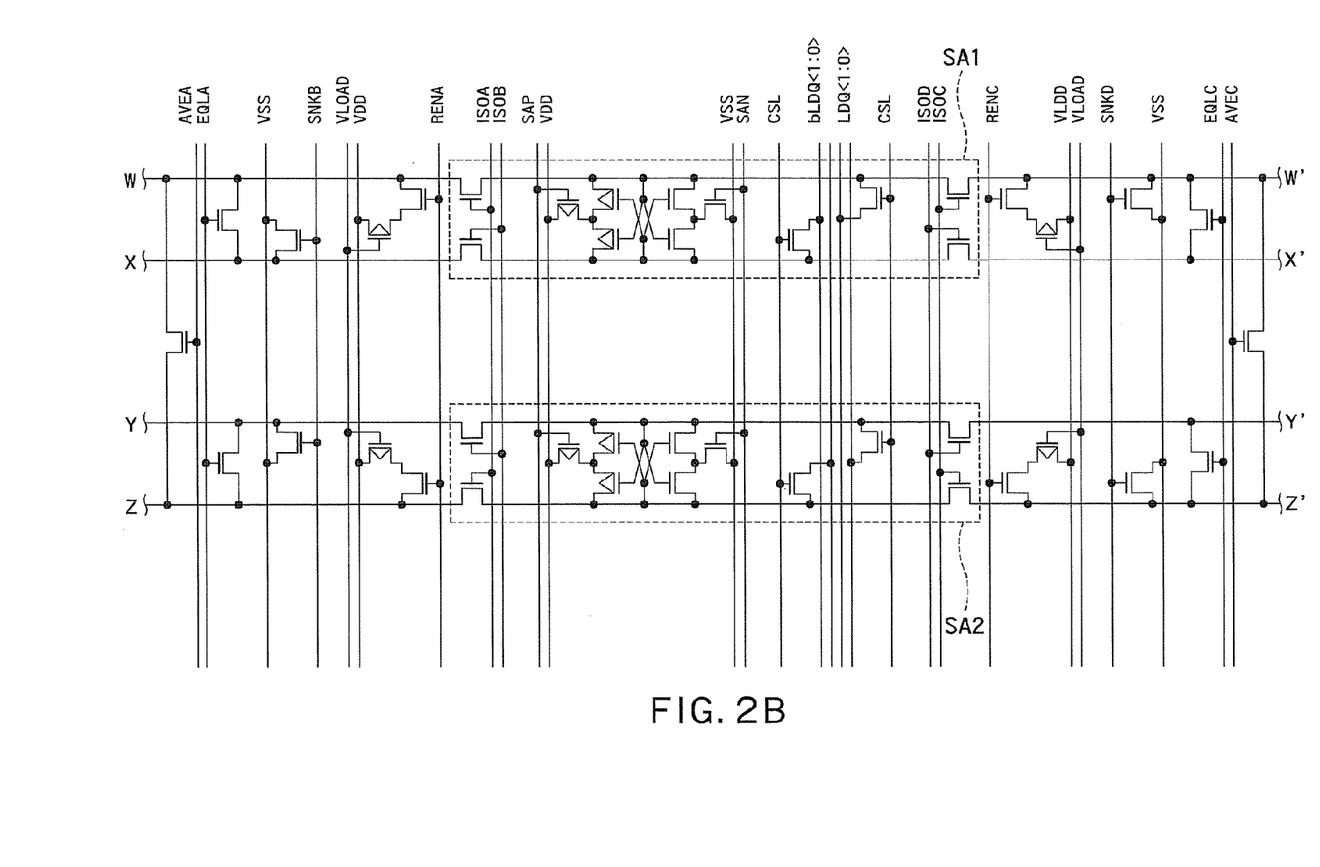
Figure 2C:
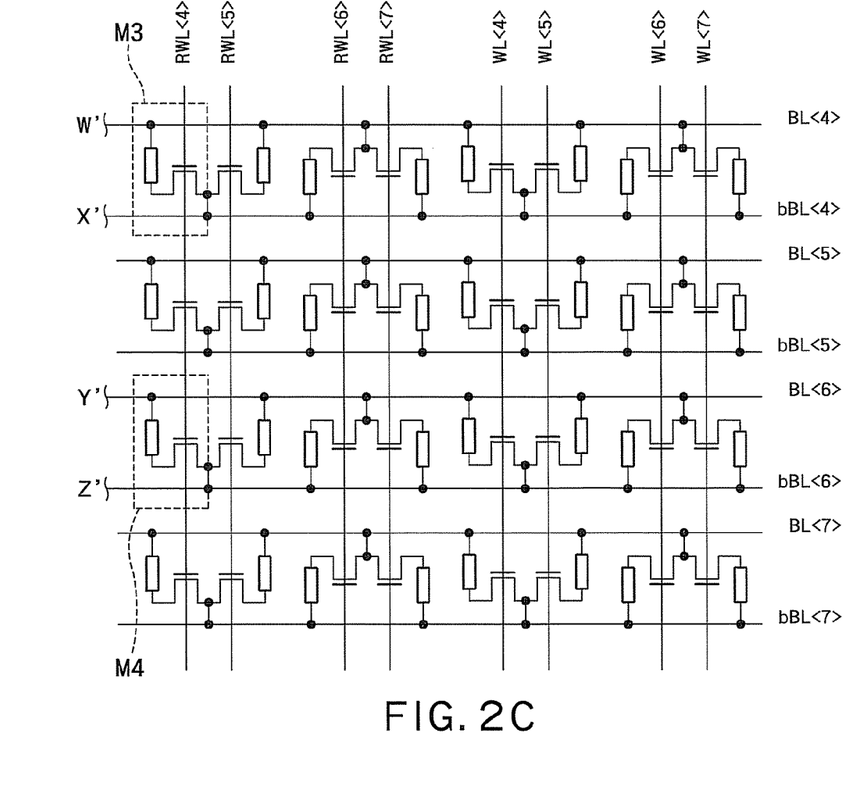

FIGS. 2A to 2C are circuit diagrams illustrating a specific layout example containing the first and second sense amplifiers SA1 and SA2 and the first to fourth memory cells M1 to M4 of the semiconductor memory 100 illustrated in FIG. 1. In FIGS. 2A and 2B, a point marked with w in FIG. 2A is connected to a point marked with w in FIG. 2B, a point marked with x in FIG. 2A is connected to a point marked with x in FIG. 2B, a point marked with y in FIG. 2A is connected to a point marked with y in FIG. 2B, and a point marked with z in FIG. 2B is connected to a point marked with z in FIG. 2C, the points being continuous. In FIGS. 2B and 2C, a point marked with w' in FIG. 2B is connected to a point marked with w' in FIG. 2C, a point marked with x' in FIG. 2B is connected to a point marked with x' in FIG. 2C, a point marked with y' in FIG. 2B is connected to a point marked with y' in FIG. 2C, and a point marked with z' in FIG. 2B is connected to a point marked with z' in FIG. 2C, the points being continuous.

The first to fourth memory cells M1 to M4 in FIG. 1 correspond respectively to the first to fourth memory cells M1 to M4 in FIGS. 2A to 2C. The first and second sense amplifiers SA1 and SA2 in FIGS. 2A to 2C correspond respectively to the first and second sense amplifiers SA1 and SA2 in FIG. 1. The first to fourth bit lines BL1 to BL4 in FIG. 1 correspond respectively to bit lines BL<0>, bBL<2>, bBL<4>, and BL<6> in FIGS. 2A to 2C. The first to fourth voltage terminals G1 to G4 in FIG. 1 are electrically connected respectively to bit lines bBL<0>, BL<2>, BL<4>, and bBL<6> in FIGS. 2A to 2C.

As shown in FIGS. 2A to 2C, the first to fourth memory cells M1 to M4 are applicable to a high-density array having high compatibility with DRAMs and the first and second sense amplifiers SA1 and SA2 are applicable to an integrated sense amplifier having high compatibility with DRAMs.

The following will describe an example of a reading operation of the semiconductor memory 100 configured thus. In this example, data stored in the memory cells of the first memory cell array A1 is read. This example is similarly applicable to reading of data stored in the memory cells of the second memory cell array A2.

In a reading operation, as has been discussed, the first and second input terminals SA1a and SA1b of the first sense amplifier SA1 are first electrically connected to the first and third bit lines BL1 and BL3, respectively. The third and fourth input terminals SA2a and SA2b of the second sense amplifier SA2 are electrically connected to the second and fourth bit lines BL2 and BL4, respectively.

Then, as has been discussed, the reading current I1 is applied to the first memory cell M1 only in the direction along which the first logical value (e.g., "1") is written (that is, the direction from the first bit line BL1 to the first voltage terminal G1).

The reading current I2 is applied to the second memory cell M2 only in the direction along which the second logical value ("0") is written (that is, the direction from the second bit line BL2 to the second voltage terminal G2).

The reading current (reference current) I3 is applied to the third memory cell M3 only in the direction along which the second logical value ("0") is written (that is, the direction from the third bit line BL3 to the third voltage terminal G3).

Thus, as has been discussed, erroneous writing can be suppressed in the third memory cell M3 acting as a reference cell.

The reading current (reference current) I4 is applied to the fourth memory cell M4 only in the direction along which the first logical value ("1") is written (that is, the direction from the fourth bit line BL4 to the fourth voltage terminal G4).

Thus, as has been discussed, erroneous writing can be suppressed in the fourth memory cell M4 acting as a reference cell.

The third bit line BL3 and the fourth bit line BL4 are kept at the same potential by the short transistor. Hence, the second and fourth input terminals SA1b and SA2b of the first and second sense amplifiers near the reference cells are set between an input voltage in a high resistance state corresponding to the first logical value ("1") and an input voltage in a low resistance state corresponding to the second logical value ("0").

The first sense amplifier SA1 compares a current passing through the one end of the selected first bit line BL1 and a current passing through the one end of the third bit line BL3 and outputs the reading signal corresponding to the comparison result. A logical value stored in the first memory cell M1 is determined based on the reading signal.

The second sense amplifier SA2 compares a current passing through the one end of the selected second bit line BL2 and a current passing through the one end of the fourth bit line BL4 and outputs the reading signal corresponding to the comparison result. A logical value stored in the second memory cell M2 is determined based on the reading signal.

As described above, the semiconductor memory according to the first embodiment can suppress erroneous writing in the reference cells, achieving more accurate reading of data.

In other words, the first embodiment can provide an MRAM including a high-density array and an integrated sense amplifier, which are highly compatible with DRAMs, while preventing erroneous writing in the reference cells.

Second Embodiment

In a second embodiment, third and fourth memory cells M3 and M4 acting as the reference cells of a second memory cell array A2 are connected in a different configuration.

Figure 3:
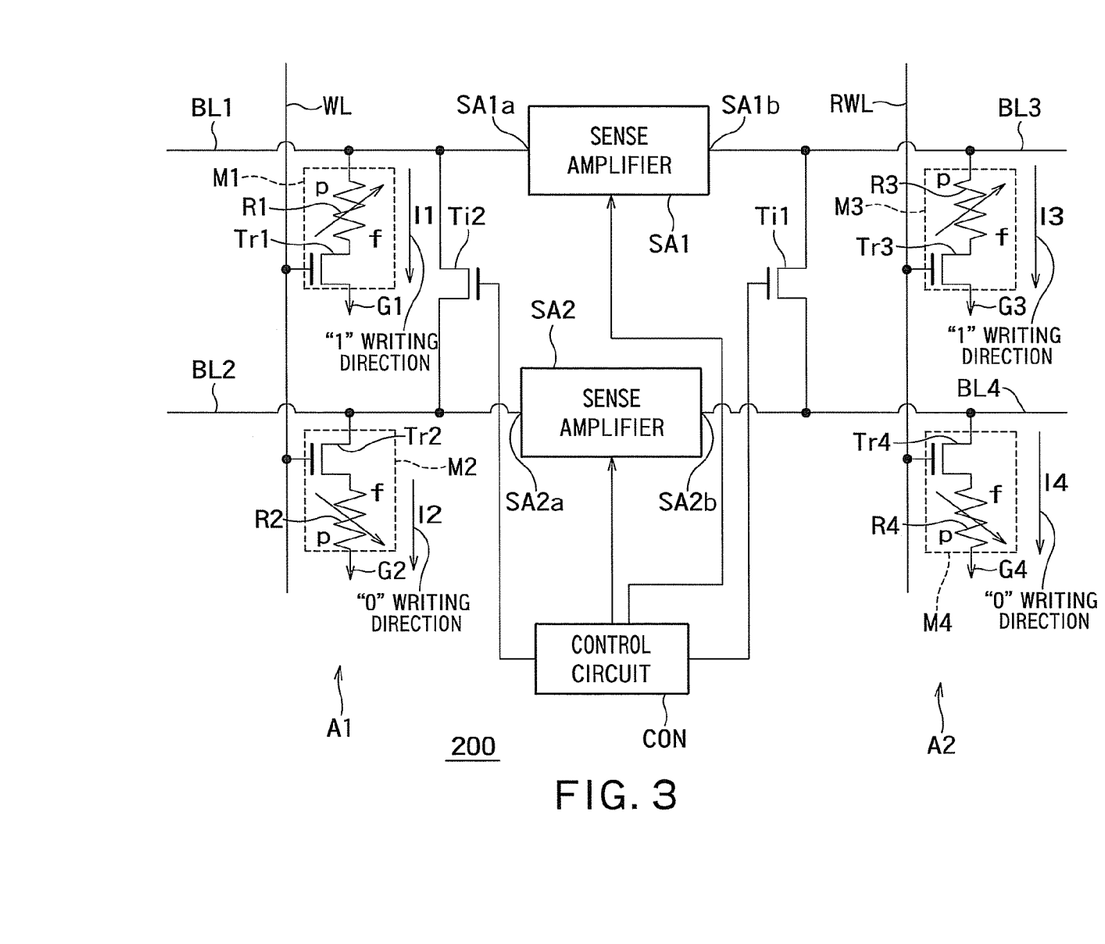
FIG. 3 is a diagram showing an example of the configuration of a semiconductor memory 200 according to the second embodiment.

FIG. 3 illustrates an example of the configuration of a semiconductor memory 200 according to the second embodiment. In FIG. 3, the same reference numerals as in FIG. 1 indicate the same configurations as in the first embodiment.

As illustrated in FIG. 3, as in the first embodiment, the semiconductor memory 200 includes a first word line WL, a second word line RWL, a first bit line BL1, a second bit line BL2, a third bit line BL3, a fourth bit line BL4, a first memory cell M1, a second memory cell M2, a third memory cell M3, a fourth memory cell M4, a first sense amplifier SA1, a second sense amplifier SA2, a first potential control circuit Ti1, a second potential control circuit Ti2, and a control circuit CON.

As described above, the third and fourth memory cells M3 and M4 acting as the reference cells of a second memory cell array A2 in the semiconductor memory 200 are connected in a different configuration from that of the semiconductor memory 100 of the first embodiment.

Specifically, as illustrated in FIG. 3, a third resistance change element R3 has one end connected to the third bit line BL3. A third select transistor Tr3 is connected between the other end of the third resistance change element R3 and a third voltage terminal G3 and has its gate connected to the second word line RWL.

Particularly, the third resistance change element R3 includes a free layer f connected to the other end of the third select transistor Tr3 and a fixed layer p connected to the third voltage terminal G3.

In the case where the third memory cell M3 acts as a reference cell, the resistance value of the third resistance change element R3 is set at a resistance value corresponding to a state in which a second logical value ("0") is written.

For example, a reading current (reference current) I3 is applied to the third memory cell M3 only in a direction along which the second logical value ("0") is written (that is, a direction from the third bit line BL3 to the third voltage terminal G3).

Thus, erroneous writing can be suppressed in the third memory cell M3 acting as a reference cell.

As illustrated in FIG. 3, a fourth select transistor Tr4 has one end (drain) connected to the fourth bit line BL4 and its gate connected to the second word line RWL. A fourth resistance change element R4 has one end connected to the other end (source) of the fourth select transistor Tr4 and the other end connected to a fourth voltage terminal G4.

Particularly, the fourth resistance change element R4 includes a fixed layer p connected to the fourth bit line BL4 and a free layer f connected to the one end of the fourth select transistor Tr4.

In the case where the fourth memory cell M4 acts as a reference cell, the resistance value of the fourth resistance change element R4 is set at a resistance value corresponding to a state in which a first logical value ("1") is written.

For example, a reading current (reference current) I4 is applied to the fourth memory cell M4 only in a direction along which the first logical value ("1") is written (that is, a direction from the fourth bit line BL4 to the fourth voltage terminal G4).

Thus, erroneous writing can be suppressed in the fourth memory cell M4 acting as a reference cell.

Other configurations of the semiconductor memory 200 are identical to those of the first embodiment.

The following will describe an example of a reading operation of the semiconductor memory 200 configured thus. In this example, data stored in the memory cells of a first memory cell array A1 is read. This example is similarly applicable to reading of data stored in the memory cells of the second memory cell array A2.

During a reading operation, as has been discussed in the first embodiment, first and second input terminals SA1$a$ and SA1$b$ of the first sense amplifier SA1 are first electrically connected to the first and third bit lines BL1 and BL3, respectively. Third and fourth input terminals SA2$a$ and SA2$b$ of the second sense amplifier SA2 are electrically connected to the second and fourth bit lines BL2 and BL4, respectively.

Then, as in the first embodiment, a reading current I1 is applied to the first memory cell M1 only in a direction along which the first logical value (e.g., "1") is written (that is, a direction from the first bit line BL1 to a first voltage terminal G1).

Then, as in the first embodiment, a reading current I2 is applied to the second memory cell M2 only in a direction along which the second logical value ("0") is written (that is, a direction from the second bit line BL2 to a second voltage terminal G2).

As has been discussed, the reading current (reference current) I3 is applied to the third memory cell M3 only in the direction along which the first logical value ("1") is written (that is, the direction from the third bit line BL3 to the third voltage terminal G3).

Thus, as has been discussed, erroneous writing can be suppressed in the third memory cell M3 acting as a reference cell.

The reading current (reference current) I4 is applied to the fourth memory cell M4 only in the direction along which the second logical value ("0") is written (that is, the direction from the fourth bit line BL4 to the fourth voltage terminal G4).

Thus, as has been discussed, erroneous writing can be suppressed in the fourth memory cell M4 acting as a reference cell.

The third bit line BL3 and the fourth bit line BL4 are kept at the same potential by a short transistor as in the first embodiment. Hence, the second and fourth input terminals SA1$b$ and SA2$b$ of the first and second sense amplifiers near the reference cells are set between an input voltage in a high resistance state corresponding to the first logical value ("1") and an input voltage in a low resistance state corresponding to the second logical value ("0")

As in the first embodiment, the first sense amplifier SA1 compares a current passing through one end of the selected first bit line BL1 and a current passing through one end of the third bit line BL3 and outputs a reading signal corresponding to the comparison result. A logical value stored in the first memory cell M1 is determined based on the reading signal.

As in the first embodiment, the second sense amplifier SA2 compares a current passing through one end of the selected second bit line BL2 and a current passing through one end of the fourth bit line BL4 and outputs a reading signal corresponding to the comparison result. A logical value stored in the second memory cell M2 is determined based on the reading signal.

As described above, the semiconductor memory according to the second embodiment can suppress erroneous writing in the reference cells, achieving more accurate reading of data as in the first embodiment.

In other words, as in the first embodiment, the second embodiment can provide an MRAM including a high-density array and an integrated sense amplifier, which are highly compatible with DRAMs, while preventing erroneous writing in the reference cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a first memory cell including: a first resistance change element having a first end connected to a first bit line, and a first select transistor that is connected between a second end of the first resistance change element and a first voltage terminal and has a gate connected to a first word line;
    a second memory cell including: a second select transistor having a first end connected to a second bit line and a gate connected to the first word line, and a second resistance change element that has a first end connected to a second end of the second select transistor and a second end connected to a second voltage terminal;
    a third memory cell including: a third select transistor that has a first end connected to a third bit line and a gate connected to a second word line, and a third resistance change element that has a first end connected to a second end of the third select transistor and a second end connected to a third voltage terminal, the third memory cell acting as a reference cell;
    a fourth memory cell including: a fourth resistance change element having a first end connected to a fourth bit line, and a fourth select transistor that is connected between a second end of the fourth resistance change element and a fourth voltage terminal and has a gate connected to the second word line, the fourth memory cell acting as a reference cell;
    a first potential control circuit connected between the third bit line and the fourth bit line to equalize a potential of the third bit line and a potential of the fourth bit line during a reading operation;
    a first sense amplifier including a first input terminal connected to a first end of the first bit line and a second input terminal connected to a first end of the third bit line, the first sense amplifier being configured to compare a current passing through a first end of the first bit line and a current passing through the first end of the third bit line during the reading operation and output a reading signal corresponding to a comparison result; and
    a second sense amplifier including a third input terminal connected to a first end of the second bit line and a fourth input terminal connected to a first end of the fourth bit line, the second sense amplifier being configured to compare a current passing through the first end of the second bit line and a current passing through the first end of the fourth bit line during the reading operation and output a reading signal corresponding to a comparison result.

2. The semiconductor memory according to claim 1, wherein a reading current is applied to the first memory cell only in a direction along which a first logical value is written,
    a reading current is applied to the second memory cell only in a direction along which a second logical value is written, the second logical value being different from the first logical value,
    a reading current is applied to the third memory cell only in a direction along which the second logical value is written, and
    a reading current is applied to the fourth memory cell only in the direction along which the first logical value is written.

3. The semiconductor memory according to claim 1, wherein a first memory cell array containing multiple memory cells including the first memory cell and the second memory cell and a second memory cell array containing multiple memory cells including the third memory cell and the fourth memory cell are arranged such that a region for the first and second sense amplifiers is interposed between the memory cell arrays, and a configuration for the first memory cell array and a configuration for the second memory cell array are laid out symmetrically to each other.

4. The semiconductor memory according to claim 2, wherein a first memory cell array containing multiple memory cells including the first memory cell and the second memory cell and a second memory cell array containing multiple memory cells including the third memory cell and the fourth memory cell are arranged such that a region for the first and second sense amplifiers is interposed between the memory cell arrays, and a configuration for the first memory cell array and a configuration for the second memory cell array are laid out symmetrically to each other.

5. The semiconductor memory according to claim 3, wherein the first memory cell array is identical in size to the second memory cell array.

6. The semiconductor memory according to claim 3, wherein the third memory cell and the fourth memory cell are laid out near a center of the second memory cell array.

7. The semiconductor memory according to claim 1, wherein the first potential control circuit is a first short transistor connected between the third bit line and the fourth bit line.

8. The semiconductor memory according to claim 1, wherein the semiconductor memory is a spin injection MRAM.

9. The semiconductor memory according to claim 1, wherein the first to fourth voltage terminals are all electrically connected to a ground terminal connected to a ground.

10. The semiconductor memory according to claim 1, wherein the first to fourth resistance change elements are MTJ elements,
    the first resistance change element includes a fixed layer connected to the first bit line and a free layer connected to the first end of the first select transistor,
    the second resistance change element includes a free layer connected to the second end of the second select transistor and a fixed layer connected to the second voltage terminal,
    the third resistance change element includes a free layer connected to the second end of the third select transistor and a fixed layer connected to the third voltage terminal, and the fourth resistance change element includes a fixed layer connected to the fourth bit line and a free layer connected to the first end of the fourth select transistor.

11. A semiconductor memory comprising:
a first memory cell including: a first resistance change element having a first end connected to a first bit line, and a first select transistor that is connected between a second end of the first resistance change element and a first voltage terminal and has a gate connected to a first word line;
a second memory cell including: a second select transistor having a first end connected to a second bit line and a gate connected to the first word line, and a second resistance change element that has a first end connected to a second end of the second select transistor and a second end connected to a second voltage terminal;
a third memory cell including: a third resistance change element that has a first end connected to a third bit line, and a third select transistor that is connected between a second end of the third resistance change element and a third voltage terminal and has a gate connected to a second word line, the third memory cell acting as a reference cell;
a fourth memory cell including: a fourth select transistor that has a first end connected to a fourth bit line and a gate connected to the second word line, and a fourth resistance change element that has a first end connected to a second end of the fourth select transistor and a second end connected to a fourth voltage terminal, the fourth memory cell acting as a reference cell;
a first potential control circuit connected between the third bit line and the fourth bit line to equalize a potential of the third bit line and a potential of the fourth bit line during a reading operation;
a first sense amplifier including a first input terminal connected to a first end of the first bit line and a second input terminal connected to a first end of the third bit line, the first sense amplifier being configured to compare a current passing through a first end of the first bit line and a current passing through the first end of the third bit line during the reading operation and output a reading signal corresponding to a comparison result; and
a second sense amplifier including a third input terminal connected to a first end of the second bit line and a fourth input terminal connected to a first end of the fourth bit line, the second sense amplifier being configured to compare a current passing through the first end of the second bit line and a current passing through the first end of the fourth bit line during the reading operation and output a reading signal corresponding to a comparison result.

12. The semiconductor memory according to claim 11, wherein a reading current is applied to the first memory cell only in a direction along which a first logical value is written,
a reading current is applied to the second memory cell only in a direction along which a second logical value is written, the second logical value being different from the first logical value,
a reading current is applied to the third memory cell only in a direction along which the second logical value is written, and
a reading current is applied to the fourth memory cell only in the direction along which the first logical value is written.

13. The semiconductor memory according to claim 11, wherein a first memory cell array containing multiple memory cells including the first memory cell and the second memory cell and a second memory cell array containing multiple memory cells including the third memory cell and the fourth memory cell are arranged such that a region for the first and second sense amplifiers is interposed between the memory cell arrays, and a configuration for the first memory cell array and a configuration for the second memory cell array are laid out symmetrically to each other.

14. The semiconductor memory according to claim 12, wherein a first memory cell array containing multiple memory cells including the first memory cell and the second memory cell and a second memory cell array containing multiple memory cells including the third memory cell and the fourth memory cell are arranged such that a region for the first and second sense amplifiers is interposed between the memory cell arrays, and a configuration for the first memory cell array and a configuration for the second memory cell array are laid out symmetrically to each other.

15. The semiconductor memory according to claim 13, wherein the first memory cell array is identical in size to the second memory cell array.

16. The semiconductor memory according to claim 13, wherein the third memory cell and the fourth memory cell are laid out near a center of the second memory cell array.

17. The semiconductor memory according to claim 11, wherein the first potential control circuit is a first short transistor connected between the third bit line and the fourth bit line.

18. The semiconductor memory according to claim 11, wherein the semiconductor memory is a spin injection MRAM.

19. The semiconductor memory according to claim 11, wherein the first to fourth voltage terminals are all electrically connected to a ground terminal connected to a ground.

20. The semiconductor memory according to claim 11, wherein the first to fourth resistance change elements are MTJ elements,
the first resistance change element includes a fixed layer connected to the first bit line and a free layer connected to the first end of the first select transistor,
the second resistance change element includes a free layer connected to the second end of the second select transistor and a fixed layer connected to the second voltage terminal,
the third resistance change element includes a fixed layer connected to the third bit line and a free layer connected to the first end of the third select transistor, and
the fourth resistance change element includes a free layer connected to the second end of the fourth select transistor and a fixed layer connected to the fourth voltage terminal.

* * * * *